United States Patent
Mori et al.

(10) Patent No.: US 8,427,374 B2
(45) Date of Patent: Apr. 23, 2013

(54) PLANAR ANTENNA AND METHOD OF MANUFACTURING THE SAME

(75) Inventors: Kentaro Mori, Shiga (JP); Kiyohiko Itoh, Shiga (JP)

(73) Assignee: Toray Industries, Inc. (JP)

( * ) Notice: Subject to any disclaimer, the term of this patent is extended or adjusted under 35 U.S.C. 154(b) by 304 days.

(21) Appl. No.: 12/739,844

(22) PCT Filed: Sep. 30, 2008

(86) PCT No.: PCT/JP2008/067747
§ 371 (c)(1),
(2), (4) Date: Apr. 26, 2010

(87) PCT Pub. No.: WO2009/054236
PCT Pub. Date: Apr. 30, 2009

(65) Prior Publication Data
US 2010/0245206 A1 Sep. 30, 2010

(30) Foreign Application Priority Data
Oct. 26, 2007 (JP) ................................. 2007-278531

(51) Int. Cl.
*H01Q 1/38* (2006.01)
(52) U.S. Cl.
USPC .................................................. 343/700 MS
(58) Field of Classification Search ............... 340/572.7; 343/700 MS, 793, 872; 29/600, 831, 592.1; 216/13
See application file for complete search history.

(56) References Cited

U.S. PATENT DOCUMENTS

| | | | |
|---|---|---|---|
| 2006/0290514 A1* | 12/2006 | Sakama et al. | 340/572.7 |
| 2007/0171129 A1* | 7/2007 | Coleman et al. | 343/700 MS |
| 2009/0219212 A1* | 9/2009 | Itoh et al. | 343/700 MS |

FOREIGN PATENT DOCUMENTS

| | | | |
|---|---|---|---|
| JP | 01-196845 A | | 7/2001 |
| JP | 2006-509280 A | | 3/2006 |
| JP | 08-213246 A | | 9/2008 |
| WO | 2006/103981 | * | 10/2006 |
| WO | 2006/103981 A1 | | 10/2006 |
| WO | 2006/109627 A1 | | 10/2006 |
| WO | WO 2006103981 A1 | * | 10/2006 |

OTHER PUBLICATIONS

International Search Report in related application PCT/JP2008/067747 mailed Jan. 13, 2009.

* cited by examiner

*Primary Examiner* — Douglas W Owens
*Assistant Examiner* — Collin Dawkins
(74) *Attorney, Agent, or Firm* — Pillsbury Winthrop Shaw Pittman LLP; Raj S. Dave

(57) ABSTRACT

To provide an inexpensive planar antenna of stable quality which has a circuit with low resistance and in which electrical continuity between the antenna and the electronic part such as IC chip is secured, a planar antenna is made to have a circuit pattern comprised of an antenna part and a connecting terminal part on a resin film, wherein the circuit pattern has a metal layer, a conductive layer provided on the top surface of the connecting terminal part of the metal layer, and a protective layer provided on the top surface of the antenna part of the metal layer and on the section from the side surface to a portion of the top surface of the conductive layer.

9 Claims, 5 Drawing Sheets

(a)

(b)

(a)

(b)

(a)

(b)

(a)

(b)

(a)

(b)

PLANAR ANTENNA AND METHOD OF MANUFACTURING THE SAME

CROSS REFERENCE TO RELATED APPLICATIONS

This application is a U.S. National phase of International Application No. PCT/JP2008/067747, filed Sep. 30, 2008, which in turn claims priority to Japanese Patent Application No. 2007-278531, filed on Oct. 26, 2007. The contents of which are incorporated herein by reference in its entirety.

TECHNICAL FIELD

The present invention relates to a planar antenna that can be suitably used as an antenna for an IC tag and an antenna for a non-contact IC card, and a method of manufacturing the same.

BACKGROUND ART

In recent years, an IC tag and a non-contact IC card carrying out transmission and reception of an electromagnetic wave signal given by a reader/writer in a non-contact fashion have been developed and put in practical use. As a planar antenna in which an antenna circuit pattern (a circuit pattern) of such non-contact IC card and IC tag is formed, a planar antenna is proposed having a circuit pattern comprised of an antenna part and a connecting terminal part on a resin film and in which the circuit pattern has a metal layer and a heat-sealable conductive layer provided on the top surface of the connecting terminal part of the metal layer (for example, Patent Document 1). This technique is advantageous for reducing cost because it enables an electronic part such as an IC chip to directly connect to the conductive layer without using wire bonding, an anisotropic conductive film (ACF) and the like used in a conventional technique. In this technique, a planar antenna is produced on a resin film with a step (a) of providing a metal layer that constitutes a circuit pattern comprised of an antenna part and a connecting terminal part on a resin film, a step (b) of providing a protective layer on a portion constituting the antenna part of the metal layer, a step (c) of providing a heat-sealable conductive layer on a portion that constitutes the connecting terminal part of the metal layer, and a step (d) of removing a portion that does not constitute the circuit pattern of the metal layer by etching after the step (b) and the step (c). That is, the portion covered with the protective layer serves as the antenna part of the circuit pattern, and the portion covered with the conductive layer serves as the connecting terminal part of the circuit pattern.
Patent Document 1: International Patent Application Laid-Open No. 2006-103981 (Claims)

DISCLOSURE OF THE INVENTION

Problems to be Solved by the Invention

However, in this method, the protective layer and the conductive layer is sometimes formed with their relative positions deviated from a desired position due to shrinkage of the resin film by heat, and the like, when the protective layer is provided and then the conductive layer is provided or when the conductive layer is provided and then the protective layer is provided. Various problems occur when removing the portion that does not constitute the circuit pattern of the metal layer by etching in this state. For example, when there is a space between the protective layer and the conductive layer, the metal layer in this space is also removed by etching, and an electrical discontinuity occurs between the antenna part and the connecting terminal part (FIG. 3), or the circuit pattern of the planar antenna varies (FIGS. 4 (a) and (b)). Because the communication characteristic of a planar antenna depends on not only the shape of the antenna part but also the entire shape of the circuit pattern including the antenna part and the connecting terminal part, individual differences occur in the communication characteristic when the circuit pattern varies.

In order to solve the above-described problems, an object of the present invention is to provide an inexpensive planar antenna of stable quality which has a circuit with low resistance and in which electrical continuity between the antenna part and the connecting terminal part is secured. Another object of the present invention is to prevent the planar antenna from having variation in the shape. Still another object of the present invention is to provide a planar antenna excellent in reliability of electrical connection with an electronic part such as an IC chip while being inexpensive and being low resistance.

Means for Solving the Problems

The present invention is configured with any of the following in order to solve the above-described problems.

(1) A planar antenna having a circuit pattern comprised of an antenna part and a connecting terminal part on a resin film, wherein the circuit pattern has a metal layer, a conductive layer provided on the top surface of the connecting terminal part of the metal layer, and a protective layer provided on the top surface of the antenna part of the metal layer and on the section from the side surface to a portion of the top surface of the conductive layer.

(2) The planar antenna according to (1), wherein the protective layer is provided on the top surface of the antenna part of the metal layer and on the section from the side surface to a peripheral part of the top surface of the conductive layer.

(3) The planar antenna according to (1) or (2), wherein the conductive layer is heat-sealable.

(4) A method of manufacturing a planar antenna, wherein the following steps are performed in this order: a step A of providing a metal layer that constitutes a circuit pattern comprised of an antenna part and a connecting terminal part on a resin film, a step B of providing a conductive layer on a portion that constitutes the connecting terminal part of the metal layer, a step C of providing a protective layer on top of a portion that constitutes the antenna part of the metal layer and on the section from the side surface to a portion of the top surface of the conductive layer, and a step D of removing a portion that does not constitute the circuit pattern of the metal layer by etching.

(5) The method of manufacturing a planar antenna according to (4), wherein the protective layer is provided on top of a portion that constitutes the antenna part of the metal layer and on the section from the side surface to a peripheral part of the top surface of the conductive layer.

(6) The method of manufacturing a planar antenna according to (4) or (5), wherein a heat-sealable conductive layer is provided in the step B.

Effects of the Invention

The planar antenna of the present invention has a configuration having a metal layer, a conductive layer provided on the top surface of a connecting terminal part of the metal layer, and a protective layer on the top surface of an antenna part of the metal layer and on the side surface and a portion of the top surface of the conductive layer. Because of that, the electrical continuity between the antenna part and the connecting terminal part is secured even when the conductive layer is formed in a position deviated from a desired position due to shrinkage of the resin film by heat, and the like, and therefore, a planar antenna of stable quality having a circuit with low resistance can be provided. When the protective layer is provided on the top surface of the antenna part of the metal layer and on the section from the side surface to a peripheral part of the top surface of the conductive layer, a planar antenna of more stable quality in which variation in the shape of the circuit pattern hardly occurs can be provided. In addition, when the conductive layer is heat-sealable, the conductive layer and an electrode part of an electronic part such as an IC chip and an IC strap can be heat-sealed and directly connected to each other by thermocompression or ultrasonic welding without using wire bonding, an anisotropic conductive film (ACF) and the like used in a conventional technique. Therefore, the planar antenna is excellent in reliability of electrical connection with an electronic part such as an IC chip. As a result, a planar antenna of stable quality can be inexpensively provided.

EXPLANATION OF THE REFERENCE NUMERALS

1 RESIN FILM
2 METAL LAYER
3 PROTECTIVE LAYER
4 HEAT-SEALABLE CONDUCTIVE LAYER
4' PORTION OF THE CONDUCTIVE LAYER THAT IS COVERED WITH THE PROTECTIVE LAYER (DASHED LINE SHOWS THE PERIPHERY)
5 CIRCUIT PATTERN
6 ANTENNA PART
7 CONNECTING TERMINAL PART
8 SPACE BETWEEN THE ANTENNA PART AND THE CONNECTING TERMINAL PART

BEST MODE FOR CARRYING OUT THE INVENTION

Figure 1:
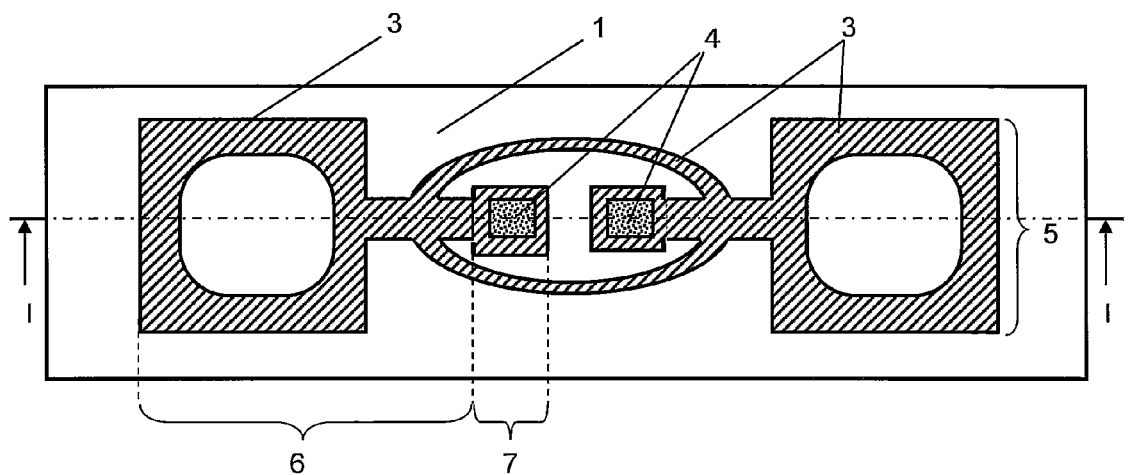
FIG. 1 is a schematic plan view of a planar antenna of the present invention.
Figure 2:
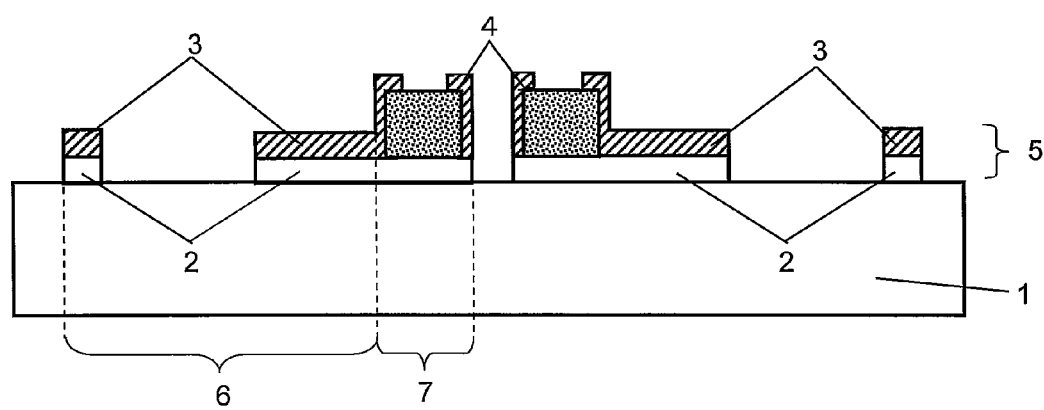
FIG. 2 is a schematic view of an I-I arrow section of the planar antenna shown in FIG. 1.
Figure 3:
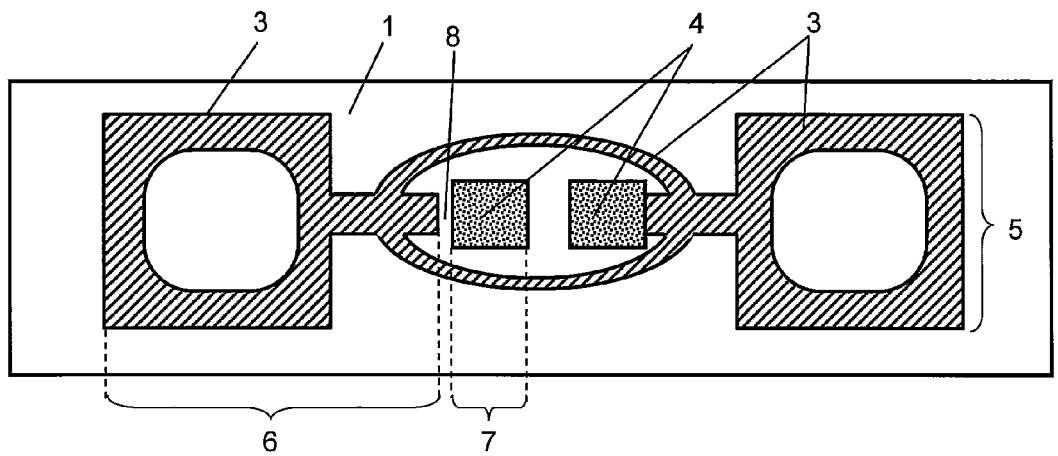
FIG. 3 is a drawing showing that a space occurs between an antenna part and a connecting terminal part when a planar antenna is produced with a method of manufacturing a planar antenna of a conventional technique.
Figure 4:
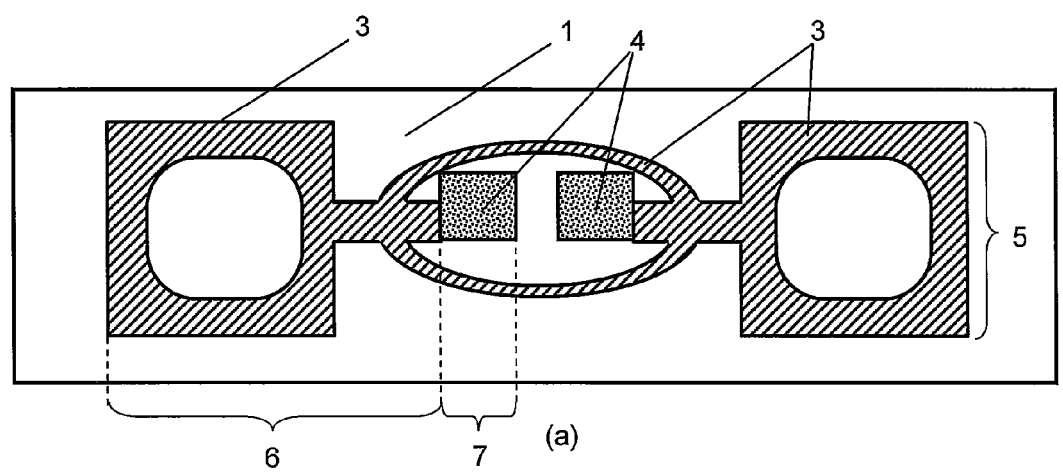
FIG. 4 is a drawing showing that a circuit pattern varies when a planar antenna is produced with a method of manufacturing a planar antenna of a conventional technique.
Figure 4:
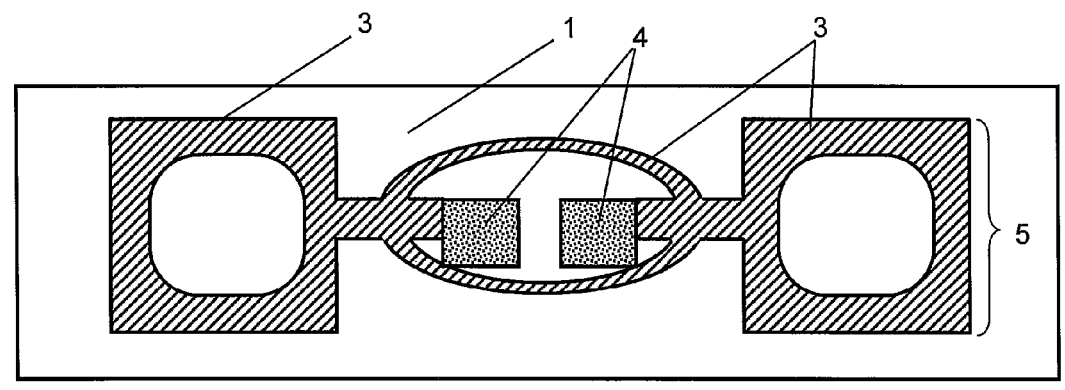
Figure 6:
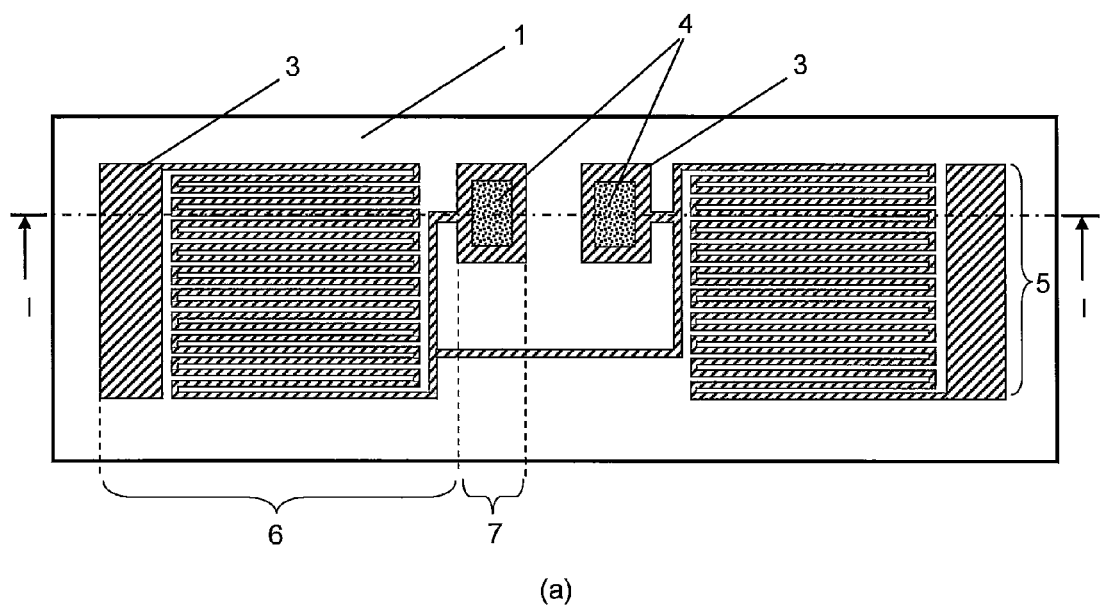
FIG. 6 is a schematic plan view of another planar antenna of the present invention and a schematic view of an I-I arrow section thereof.
Figure 6:
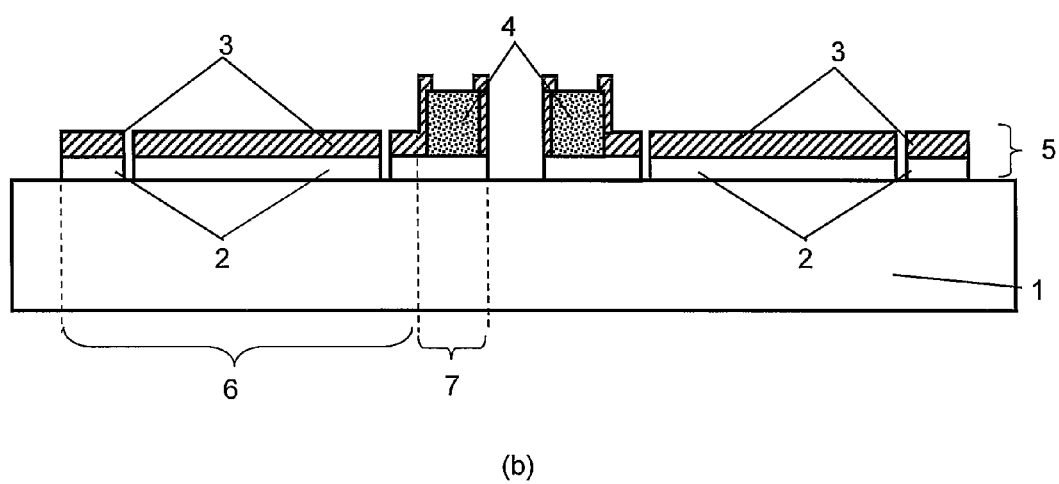
Figure 7:
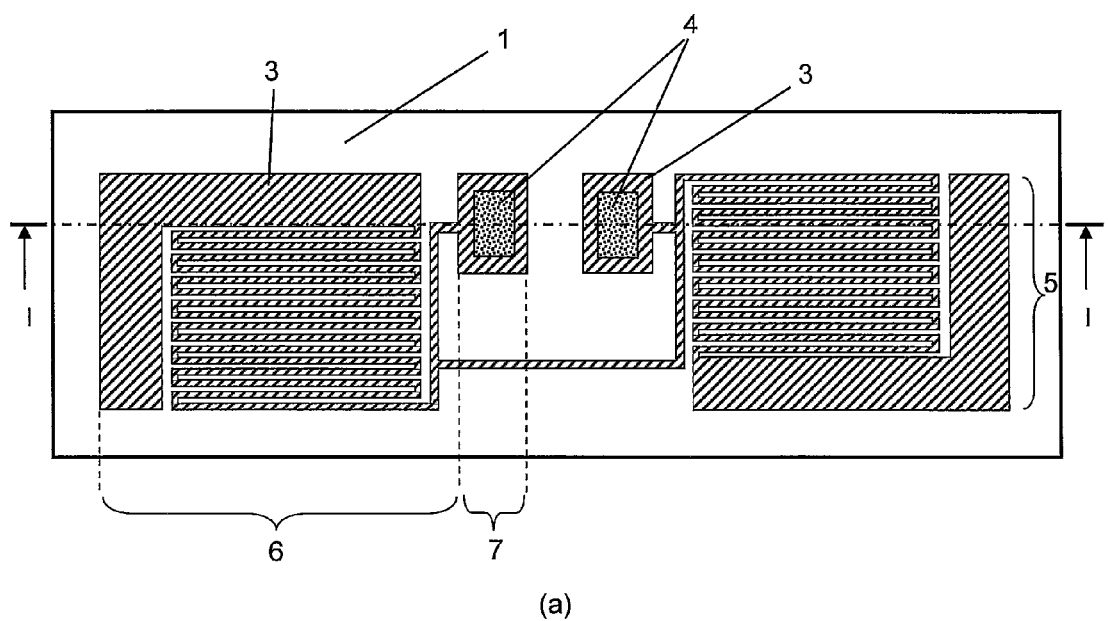
FIG. 7 is a schematic plan view of another planar antenna of the present invention and a schematic view of an I-I arrow section thereof.
Figure 7:
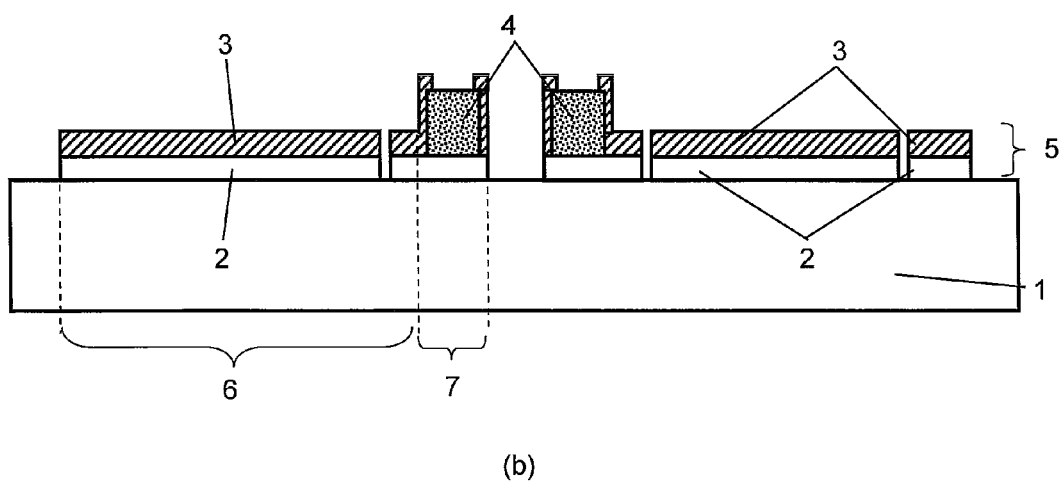

The planar antenna of the present invention, as shown in FIGS. 1 and 2 for example, has a configuration having a circuit pattern 5 comprised of an antenna part and a connecting terminal part on a resin film 1, in which the circuit pattern 5 has a metal layer 2, a heat-sealable conductive layer 4 provided on the top surface (the surface layer) of the connecting terminal part of the metal layer 2, and a protective layer 3 on the top surface (the surface layer) of the antenna part of the metal layer 2 and on the section from the side surface to a portion of the top surface of the conductive layer 4. The planar antenna of the present invention is not limited to the configuration shown in FIGS. 1 and 2, and it may have a configuration as shown in FIGS. 6 and 7 for example.

In the present invention, the protective layer is not always necessarily provided on a peripheral part on the top surface of the conductive layer. That is, the protective layer may be provided successively on the top surface of the antenna part of the metal layer and on the section from the side surface to a portion of the top surface of the conductive layer. However, it is preferable to provide the protective layer on the entire area of the top surface of the antenna part of the metal layer and of the section from the side surface to the peripheral part of the top surface of the conductive layer in order to provide a planar antenna of more stable quality that prevents the shape of the circuit pattern from varying.

"The top surface of the conductive layer" refers to the surface of the conductive layer of the side that is shown in FIG. 1. "The side surface of the conductive layer" refers to the surface that intersects with the top surface and a portion drawn in the up and down direction in FIG. 2.

"The protective layer provided on the section from the side surface to a portion of the top surface of the conductive layer" refers to the protective layer that covers the top surface a little in addition to the side surface of the conductive layer, and "the protective layer provided on the section from the side surface to the peripheral part of the top surface of the conductive layer" is the protective layer that covers the conductive layer excluding a center portion of the top surface of the conductive layer.

Because the terminal part of an electronic part is mounted on the center portion of the top surface of the conductive layer that is not covered with the protective layer, the size of this portion can be arbitrarily determined depending on the size of the terminal part of the electronic part. The size is normally preferably in a range of 50 to 95% of the area of the top surface of the conductive layer. When the area of the top surface of the conductive layer that is not covered with the protective layer is 50% or more, it is preferable because good adhesiveness to an electronic part such as an IC chip and an IC strap can be achieved. When the area is 95% or less, it is preferable because the conductive layer does not protrude from the protective layer provided on the periphery as described later and the circuit pattern becomes constant even though the conductive layer is formed on a position deviated from a desired position due to shrinkage of the resin film by heat, and the like, upon forming the conductive layer on the desired position.

The planar antenna of the present invention having such configuration can be obtained by performing a step A of providing a metal layer that constitutes a circuit pattern comprised of an antenna part and a connecting terminal part on a resin film, a step B of providing a conductive layer (preferably, a heat-sealable conductive layer) on a portion that constitutes the connecting terminal part of the metal layer, a step C of providing a protective layer on top of a portion that constitutes the antenna part of the metal layer and on the section from the side surface to a portion (preferably a peripheral part) of the top surface of the conductive layer, and a step D of removing a portion that does not constitute the circuit pattern of the metal layer by etching in this order.

"Providing a protective layer on the section from the side surface to a portion of the top surface of the conductive layer" is an important point to achieve the object of the present invention. With this, even though the relative position of the conductive layer to the protective layer before performing the step D is deviated from a desired position, electrical continuity between the antenna part and the connecting terminal part can be secured after a portion of the metal layer that is not covered with the conductive layer or the protective layer is removed. That is, the space does not occur between the antenna part and the connecting terminal part, and the electrical continuity can be secured without depending on the relative position of the conductive layer to the protective layer.

Figure 5:
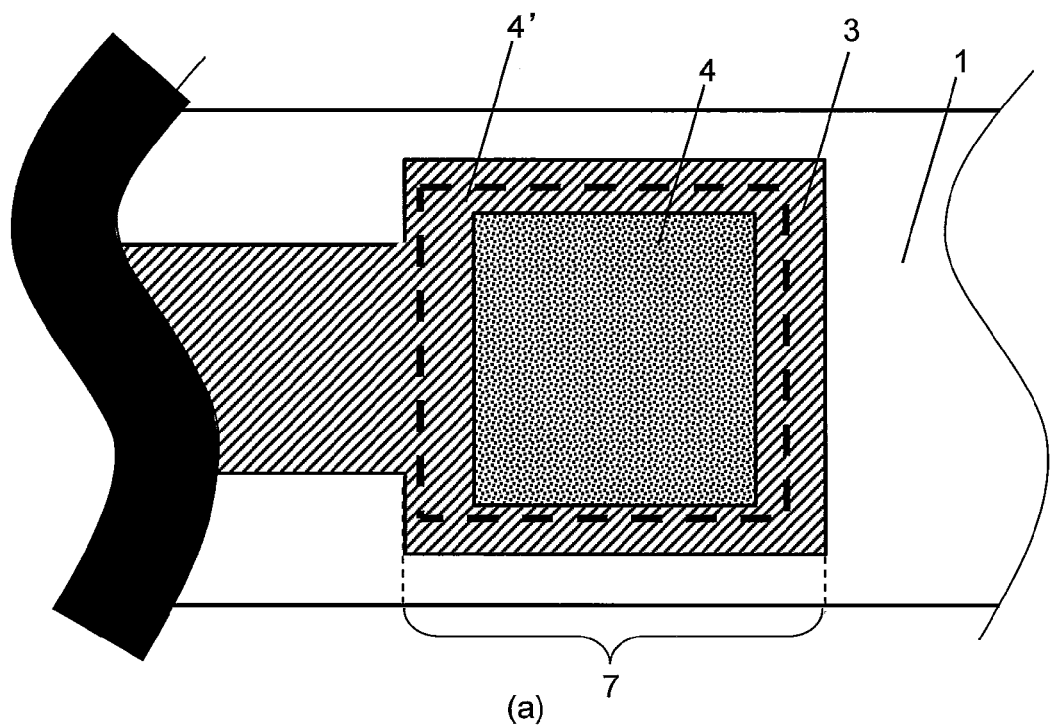
FIG. 5 is a drawing showing that a circuit pattern becomes constant when a planar antenna is produced with a method of manufacturing a planar antenna of the present invention (an enlarged view of the connecting terminal part).
Figure 5:
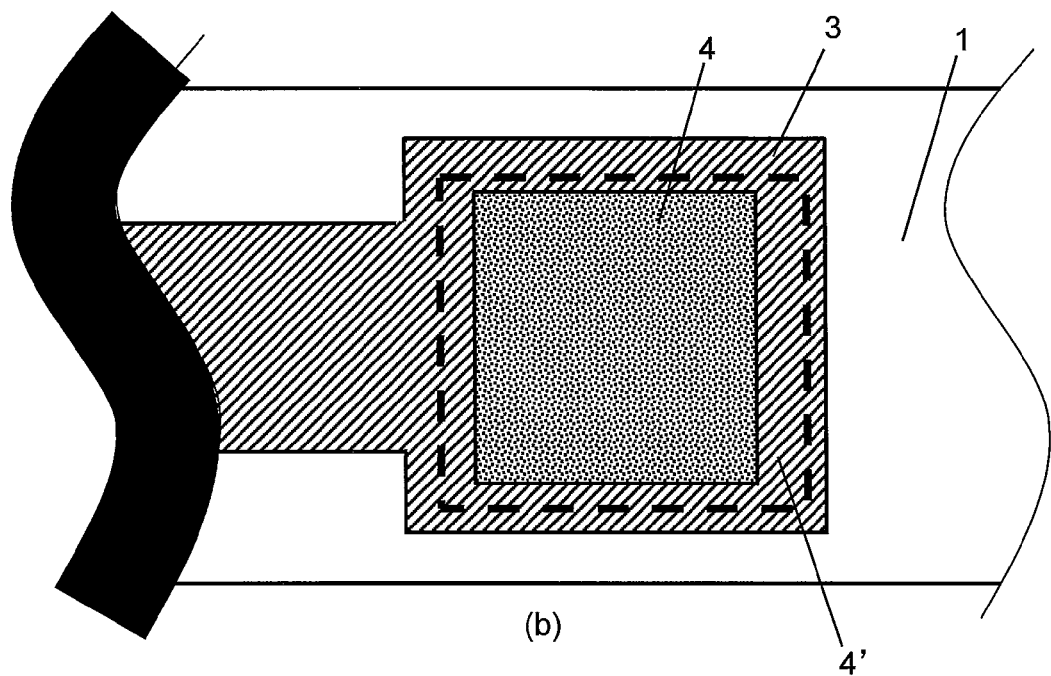

In the present invention, "providing a protective layer on the section from the side surface to a peripheral part of the top surface of the conductive layer" is preferable to achieve the object of the present invention. With this, even though the relative position of the conductive layer to the protective layer before performing the step D is different as shown in FIGS. 5 (a) and (b), a portion of the metal layer that is not covered with the conductive layer or the protective layer is removed by etching in the step D, and the circuit pattern that can be finally obtained becomes a pattern of the periphery of the protective layer; that is, any of them becomes the same shape. That is, since a space does not occur between the antenna part and the connecting terminal part and the electrical continuity is secured without depending on the relationship of the relative position of the conductive layer to the protective layer, and the circuit pattern is also kept constant, variation in the communication characteristic can be prevented from occurring. The method of manufacturing the planar antenna of the present invention will be described later in detail.

The resin film 1 in the present invention is a film obtained by processing a material that can be molded by melt-extrusion, such as polyester, foamable polyester, polyolefin, polylactic acid, polyamide, polyester amide, polyether, polystyrene, polyphenylene sulfide, polyether ester, polyvinyl chloride, and polymethacrylic ester, and it may be any one of an unstretched film, a monoaxially stretched film, and a biaxially stretched film.

Among them, a polyester film, a polyolefin film, and a polyphenyl sulfide film are preferable in terms of price and mechanical characteristics, and a biaxially stretched polyester film is particularly preferable because it is superior in balance of price, heat resistance, and mechanical characteristics.

The thickness of the resin film 1 used in the present invention is preferably 1 to 250 μm, more preferably 10 to 125 μm, and further preferably 20 to 75 μm in terms of bend performance and mechanical strength. A film where two or more films are laminated together can also be used as the resin film 1 in the present invention. The measurement of the thickness can be performed according to JIS-K-7130:1999.

The metal layer 2 in the present invention may be a layer comprised of a metal. It is preferably a layer comprised of a metal excellent in electric conductivity, such as aluminum, gold, platinum, silver, palladium, copper, iron, nickel, tin, and zinc. The metal layer 2 is obtained with a method of laminating on a resin film a metal foil obtained by a normal known method such as rolling, or with a method of forming by a sputtering method, a vacuum vapor deposition method, an electron beam vapor deposition method, an ion plating vapor deposition method, a wet plating method and the like.

The surface resistance value of the metal layer 2 in the present invention is preferably 0.5 to 200 mΩ/sq, and more preferably 0.5 to 100 mΩ/sq. When the metal layer 2 having a surface resistance value of 200 mΩ/sq or less is used as an antenna of an IC tag or the like, a better communication characteristic (sensitivity) is obtained. On the other hand, when the surface resistance value is less than 0.5 mΩ/sq, there is a necessity of using an expensive precious metal or a necessity of making the thickness of the metal layer itself large even though the antenna is able to obtain a good communication characteristic (sensitivity). As a result, the planar antenna becomes expensive. Therefore, the upper limit is preferably 200 mΩ/sq, and more preferably 100 mΩ/sq, and most preferably 50 mΩ/sq. The lower limit is preferably 0.5 mΩ/sq.

The thickness of the metal layer 2 is desirably 0.2 to 10 μm. When the thickness is 0.2 μm or more, it is preferable because the volume resistivity and the impedance in the high frequency region become small and the characteristic as a circuit becomes good. On the other hand, when the thickness is 10 μm or less, it is not too thick, and not only does it become easy to form the shape of the circuit by etching, but also the flexibility of the planar antenna becomes good. As a result, even if bending is repeated, it hardly decrease the adhesion between the metal layer and the resin film and peeling and cracking of the metal layer are hardly to be occurred. Therefore, the communication characteristic as an antenna is hardly to be deteriorate.

Anyone of a thermosetting resin and a photo-curable resin such as an ultraviolet-curable resin may be used as the protective layer 3 in the present invention. As the thermosetting resin, one obtained by mixing a resin such as a polyester resin, a phenoxy resin, an epoxy resin and a polyester resin with a solvent and a binder and stirring the mixture can be used. As the photo-curable resin, one or more resins selected from an unsaturated polyester resin, a polyester acrylate resin, a urethane acrylate resin, a silicone acrylate resin, an epoxy acrylate resin and the like can be used. If necessary, its photo initiator and the like can be mixed therein. Naturally enough, a curing agent, a curing promoter, a binder, a viscosity regulator such as a filler that improves printability may be mixed into these resins depending on necessity. In order to form a conductive layer and a protective layer, natural drying, heat drying by hot air or an infrared heater, and active ray irradiation such as by ultraviolet ray are normally used as a curing method for a circuit pattern printed.

The thickness of the protective layer 3 is preferably in a range of 0.3 to 6 μm, and more preferably in a range of 0.5 to 4 μm. When the thickness is 0.3 μm or more, it is preferable because the formation of the circuit pattern by printing becomes easy. When the thickness is 6 μm or less, it is preferable because it is not too thick, the surface becomes flat, and the lamination of the resin film and the formation of an adhesive layer on top of it become easy. When the protective layer is formed with a screen printing method, the thickness thereof can be adjusted by changing the mesh of a screen printing plate, the thickness of the emulsion of the masking part, the type, thickness, and shape of the squeegee, the angle of the squeegee and the screen printing plate, the moving speed of the squeegee, the heights of the screen printing plate and the object to be printed, and the like, when printing. When the protective layer is formed with a gravure printing method, the groove depth of the gravure printing plate and the push pressure of the back roll may be appropriately adjusted.

The color of the protective layer 3 is preferably darker than that of the conductive layer 4. When the terminal of an electronic part such as an IC chip and an IC strap is mounted on the conductive layer, the position of the conductive layer is specified using a reflection type or a transmission type image recognition device. However, it becomes difficult to detect the conductive layer with the image recognition device because of the reflection of light when the conductive layer has a whitish color. At this time, when the protective layer has a dark color like a blackish color, the protective layer can be easily detected with the image recognition device, and the position of the conductive layer can be specified indirectly. That is, mounting slippage of the electronic part such as an IC chip and an IC strap decreases, a stable communication characteristic can be maintained, and productivity of a non-contact IC card and an IC tag can be improved remarkably. The shade of the protective layer 3 and the conductive layer 4 can be determined by the brightness measured based on Japanese Industrial Standards JISK5600-4-5.

A silane coupling agent, a titanate primer and the like may be provided between the metal layer 2 and the protective layer 3 in order to improve the adhesiveness between the metal layer 2 and the protective layer 3. Further, a conductive layer may be provided between the metal layer 2 and the protective layer 3 that are the surface layer of the antenna part for decreasing the electric resistance of the metal layer.

The conductive layer 4 in the present invention may be formed from any material as long as electrical continuity with the electric part such as an IC chip to be mounted can be secured. However, by making such conductive layer 4 be a heat-sealable layer by making it a layer comprised of a resin composition in which conductive particles are contained in a heat-sealable resin, and the like, bonding with the electronic part such as an IC chip and an IC strap can be performed at a low temperature (for example, 60 to 70° C.). "Heat-sealable" in the present invention refers to a condition in which a part or an entire of the material is melted when a temperature of 200° C. or less is applied.

Examples of the conductive particles that can be used include known particles such as metallic particles of metal, alloys, metal oxides, for example, of gold, silver, copper, aluminum, platinum, iron, nickel, tin, zinc, solder, stainless steal, ITO, and ferrite, conductive carbon (including graphite) particles, and resin particles obtained by plating the above-described particles.

Examples of the resin constituting the conductive layer 4 that can be used include a thermosetting resin having a polyester resin, a phenoxy resin, an epoxy resin, a polyester resin or the like as a main component, and a photo-curable resin such as an ultraviolet-curable resin having an unsaturated polyester resin, a polyester acrylate resin, a urethane acrylate resin, a silicone acrylate resin, an epoxy acrylate resin or the like as a main component. Two or more of the thermosetting resins and photo-curable resins such as an ultraviolet-curable resin may be mixed and used, and a flame retarder, a photo sensitizer, a photo initiator, a curing agent, a curing promoter, a binder, a viscosity regulator such as a filler that improves printability, and the like may be mixed therein if necessary.

The surface resistance of the conductive layer 4 is preferably in a range of 0.5 to 200 mΩ/sq. If the surface resistance of the conductive layer 4 is 200 Ωm/sq or less, it is preferable because electrical bonding of the conductive layer 4 to an electronic part such as an IC chip and an IC strap becomes easy and a good communication characteristic as an IC tag or an IC card is easily obtained. When the surface resistance of the conductive layer 4 is 0.5 Ωm/sq or more, it is preferable because a planar antenna having a good communication characteristic can be formed inexpensively without using a precious metal that is expensive and that has low resistance such as platinum and gold as the conductive particles.

The thickness of the conductive layer 4 is preferably in a range of 1 to 20 μm. When the thickness of the conductive layer 4 is 1 μm or more, it is preferable because the electric resistance becomes small and the adhesiveness with the electronic part such as an IC chip and an IC strap is good. When the thickness of the conductive layer 4 is 20 μm or less, the difference of the thickness thereof and that of the protective layer 3 becomes small, and thus the circuit pattern is easily formed at the side surface and the periphery of the top surface of the conductive layer 4. Further, the surface becomes flat, and the lamination of the resin film on top of it and the formation of an adhesive layer become easy. In addition, it is preferable because the communication characteristic of for example an IC tag become stable since cracking at the connecting terminal part and variation of the electrical conductivity is hardly occurred when bending is repeated.

The method of manufacturing the planar antenna of the present invention will be specifically explained. For example, the metal layer 2 is provided on the entire surface of the resin film 1 with the above-described method (a step A), and then a heat-sealable conductive resin composition is formed by printing on the connecting terminal part of the circuit pattern 5 with a screen printing method or a gravure printing method. That is, the conductive layer 4 is provided on the connecting terminal part of the circuit pattern 5 (a step B). After that, the circuit pattern 5 is formed by printing on a portion excluding a center portion of the top surface of the conductive layer 4 with an ink composition comprised of a non-conductive resin and the like with a screen printing method or a gravure printing method. At this time, the ink composition comprised of a non-conductive resin and the like may be printed on the antenna part of the circuit pattern 5 and on the section from the side surface to a portion of the top surface of the conductive layer 4. However, by printing on the entire portion excluding a center portion of the top surface of the conductive layer 4, the protective layer 3 is provided on the antenna part of the circuit pattern 5 and on the section from the side surface to a peripheral part of the top surface of the conductive layer 4 (a step C). Then, the protective layer 3 and the conductive layer 4 are cured with an active ray such as UV or by drying and heating. After that, a portion of the metal layer 2 that does not constitute the circuit pattern 5, that is, a portion of the metal layer that is not covered with the protective layer 3 or the conductive layer 4, is removed (a step D).

When the metal layer is provided in the step A, its thickness is made to be 0.2 to 50 μm, and preferably 0.2 to 10 μm. When the thickness of the metal layer is in the above-described range, the etching becomes easy, and the communication characteristic (sensitivity) when it is used as an antenna of, for example, an IC tag can be satisfactory.

When the metal layer comprised of aluminum is provided in the step A, in addition to the above-described effect, an alkali-resistant protective layer and an alkali-resistant conductive layer are provided, and alkali etching can be performed using a sodium hydroxide solution, a potassium hydroxide solution or the like when the etching is performed in the step D. Because of that, removal of the unnecessary metal portion can be carried out rapidly and precisely.

Further, when the metal layer is provided by vapor deposition in the step A, the alkali-etching speed can be increased two times or more over that of the metal layer comprised of a metal foil having the same thickness, and the productivity can be improved substantially.

In the step B, the thickness of the conductive layer is preferably in a range of 1 to 50 μm. By making the thickness of the conductive layer 50 μm or less, the difference in level at the boundary between the conductive layer and other portions becomes small, and it can be made to be flat even when it is wound up into a roll (that is, unevenness can be prevented from occurring). On the other hand, by making the thickness of the conductive layer 1 μm or more, the electrical bonding to the electrode part of an IC chip, an IC strap or the like can be made to be good.

In the step B, when the heat-sealable conductive layer is provided on the surface layer of a portion that constitutes a connecting terminal part of the metal layer, it is preferable to adjust the printing thickness so that the surface resistance value of the conductive layer obtained becomes 200 mΩ/sq or less by dispersing conductive particles and the like into the above-described resin. However, the thickness is preferably 50 μm or less as described above.

In the step C, the protective layer of the circuit pattern is formed by printing using a screen in which a prescribed circuit pattern is formed for example. After screen printing, it is dried at 50 to 100° C. for 4 to 5 minutes for example.

In the step D, when copper is used to form the metal layer for example, the planar antenna that is in the middle of manufacturing is immersed for a few minutes in a ferric chloride solution of about 3% by weight that is heated to 40 to 45° C., and then it is washed with water. When aluminum is used to form the metal layer, the planar antenna is immersed for a few minutes in a sodium hydroxide solution or a potassium hydroxide solution of about 2% by weight that is heated to 40 to 45° C., it is neutralized with hydrochloric acid, acetic acid or the like, and it is washed with water. In such process, the portion that does not become the circuit pattern in the metal layer can be removed (etched).

EXAMPLES

Hereinafter, the present invention will be explained by examples. However, the present invention is not limited thereto. Methods of evaluating the electrical continuity between the antenna part and the connecting terminal part of the planar antennas manufactured in Example and Comparative Example and the variations in the shape of the planar antennas will be described below.

[Evaluation Methods]

1. Electrical Continuity Between the Antenna Part and the Connecting Terminal Part of the Planar Antenna The electrical continuity between the antenna part and the connecting terminal part of the planar antenna was confirmed by using a digital multimeter "PC500" manufactured by Sanwa Electric Instrument Co., Ltd. Test pins were applied to each of the antenna part and the connecting terminal part of the planar antenna, and confirmation of the continuity was performed depending on whether the buzzer sounds. In a case that the buzzer sounded, it was judged that there was electrical continuity. In a case that the yield of numbers of the planar antennas in which the buzzer sounded was 98% or more, it was judged to be good, and in a case that it was less than 98%, it was judged to be insufficient. The confirmation was carried out on 100 planar antennas, and the yield was calculated with the following formula (1).

$$\text{Yield (\%)} = (\text{Number of planar antennas in which the buzzer sounded})/(100 \text{ planar antennas}) \times 100 \quad (1)$$

2. Variations in the Shape of the Planar Antenna

The planar antenna was observed with a digital microscope "VHX200" manufactured by Keyence Corporation, and the dimension of the circuit pattern was measured. In a case that the yield of the number of planar antennas having a maximum value of deviation in dimension from the dimension of a desired circuit pattern within 50 μm (absolute value) was 95% or more, it was judged to be good, and in a case that it was less than 95%, it was judged to be insufficient. The measurement was carried out on 100 planar antennas, and the yield was calculated with the following formula (2).

$$\text{Yield (\%)} = (\text{Number of planar antennas having a maximum value of deviation in dimension within } 50 \text{ μm (absolute value)})/(100 \text{ planar antennas}) \times 100 \quad (2)$$

Example 1

A metal layer 2 of 3 μm was formed on the entire surface of one side of a biaxially stretched polyethylene terephthalate film (LUMIRROR S10 manufactured by Toray Industries, Inc.) having a thickness of 50 μm as the resin film 1 by vapor-depositing aluminum using an induction heating type vapor deposition apparatus. Then, in order to form the connecting terminal part, a heat-sealable conductive layer 4 (RAFS005 manufactured by Toyo Ink Mfg. Co., Ltd.) was screen-printed with a thickness of 5 μm on the metal layer 2, and then it was heated and dried at 100° C. for 10 minutes. Further, in order to form the circuit pattern, a protective layer 3 (Tetoron 990 Black manufactured by Jujo Chemical Co., Ltd.) was screen-printed with a thickness of 5 μm on the top surface of the antenna part of the metal layer 2 and on the section from the side surface to a peripheral part of the top surface of the conductive layer 4, and then it was heated and dried at 100° C. for 10 minutes. Finally, the planar antenna shown in FIGS. 1 and 2 was obtained by treating the resin film in which this circuit pattern was printed with a 2% by weight aqueous sodium hydroxide solution at 40° C. for 5 minutes and by dissolving and removing a portion of the aluminum vapor deposited layer where the circuit pattern was not printed.

When the electrical continuity between the antenna part and the connecting terminal part of the obtained planar antenna was confirmed, the yield was extremely good, being 100%. When the variation in the shape of the obtained planar antenna was measured, the yield was extremely good, being 99%.

Comparative Example 1

The planar antenna was produced with the same method as Example 1 except that the protective layer 3 was formed only on the top surface of the antenna part of the metal layer 2 (not provided on the section from the side surface to a peripheral part of the top surface of the conductive layer 4) in Example 1.

When the electrical continuity between the antenna part and the connecting terminal part of the obtained planar antenna was confirmed, the yield was insufficient, being 95%.

When the variation in the shape of the obtained planar antenna was measured, the yield was insufficient, being 80%.

INDUSTRIAL APPLICABILITY

If the planar antenna of the present invention is used, an IC tag and a non-contact IC card of stable quality can be provided inexpensively. Further, because the electrical continuity with the electronic part such as an IC chip can be performed easily, the productivity of the IC tag and the non-contact IC card can be improved remarkably.

The invention claimed is:

1. A planar antenna comprising a circuit pattern comprising an antenna part and a connecting terminal part on a resin film, wherein the circuit pattern comprises:

a metal layer disposed on the resin film, a conductive layer provided on a first portion of the metal layer associated with the connecting terminal part, and a protective layer comprising a non-conductive resin provided continuously on a top surface of the conductive layer from a surface of a second portion of the metal layer associated with the antenna part to a peripheral portion of the top surface of the conductive layer through a peripheral side surface of the conductive layer, with an inside of the peripheral portion of the top surface of the conductive layer.

2. The planar antenna according to claim 1, wherein the conductive layer is heat-sealable.

3. The planar antenna of claim 1, wherein the peripheral portion of the top surface of the conductive layer comprises substantially a full peripheral portion of the top surface.

4. A method of manufacturing a planar antenna, comprising:
(A) providing a metal layer that constitutes a circuit pattern comprising an antenna part and a connecting terminal part on a resin film,
(B) providing a conductive layer on a first portion of the metal layer associated with the connecting terminal part, and
(C) providing a protective layer comprising a non-conductive resin continuously on a top surface of the conductive layer from a surface of a second portion of the metal layer associated with the antenna part to a peripheral portion of the top surface of the conductive layer through a peripheral side surface of the conductive layer, with an inside of the peripheral portion of the top surface of the conductive layer.

5. The method of manufacturing a planar antenna according to claim 4, wherein a heat-sealable conductive layer is provided in the step B.

6. The method of manufacturing a planar antenna according to claim 4, wherein the steps A to C are performed sequentially.

7. The method of manufacturing a planar antenna according to claim 4, further comprising: (D) removing a portion that does not constitute the circuit pattern of the metal layer by etching.

8. The method of claim 7, wherein the steps A to D are performed sequentially.

9. The method of claim 4, wherein the peripheral portion of the top surface of the conductive layer comprises substantially a full peripheral portion of the top surface.

* * * * *